(12) United States Patent
Horiuchi

(10) Patent No.: US 9,159,404 B2
(45) Date of Patent: Oct. 13, 2015

(54) NONVOLATILE MEMORY DEVICE

(71) Applicant: NSCore, Inc., Fukuoka (JP)

(72) Inventor: Tadahiko Horiuchi, Tokyo (JP)

(73) Assignee: NSCore, Inc., Fukuoka (JP)

( * ) Notice: Subject to any disclaimer, the term of this patent is extended or adjusted under 35 U.S.C. 154(b) by 0 days.

(21) Appl. No.: 14/190,292

(22) Filed: Feb. 26, 2014

(65) Prior Publication Data

US 2015/0243348 A1    Aug. 27, 2015

(51) Int. Cl.
*G11C 5/06*    (2006.01)
*G11C 11/419*    (2006.01)

(52) U.S. Cl.
CPC ............... *G11C 11/419* (2013.01); *G11C 5/06* (2013.01)

(58) Field of Classification Search
CPC ..................................... G11C 7/12; G11C 5/06
USPC .................................................... 365/72, 205
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,768,192 A | 6/1998 | Eitan | |
| 5,956,269 A | 9/1999 | Ouyang et al. | |
| 6,038,168 A | 3/2000 | Allen et al. | |
| 6,064,590 A | 5/2000 | Han et al. | |
| 6,335,554 B1 | 1/2002 | Yoshikawa | |
| 6,642,586 B2 | 11/2003 | Takahashi | |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 6,992,914 B2 * | 1/2006 | Nishihara | ............ 365/145 |
| 7,151,706 B2 | 12/2006 | Nakamura | |
| 7,227,234 B2 | 6/2007 | Roizin et al. | |
| 8,451,657 B2 | 5/2013 | Horiuchi | |
| 8,547,723 B2 * | 10/2013 | Tanaka et al. | ............ 365/72 |
| 2004/0232477 A1 | 11/2004 | Iwata et al. | |
| 2004/0252554 A1 | 12/2004 | Fournel et al. | |
| 2006/0193174 A1 | 8/2006 | Choi et al. | |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO 2004/057621 | 7/2004 |
| WO | WO 2006/093629 | 9/2006 |

* cited by examiner

*Primary Examiner* — Michael Tran
(74) *Attorney, Agent, or Firm* — IPUSA, PLLC

(57) ABSTRACT

A nonvolatile memory device includes a word line, four or more bit lines, three or more MIS transistors having gate nodes thereof connected to the word line, the N-th (N: positive integer) one of the MIS transistors having two source/drain nodes thereof connected to the N-th and N+1-th ones of the bit lines, respectively, a sense circuit having two nodes and configured to amplify a difference between potentials of the two nodes, and a switch circuit configured to electrically couple the N-th and N+2-th ones of the bit lines to the two nodes of the sense circuit, respectively, and to electrically couple the N+1-th one of the bit lines to a fixed potential, for any numerical number N selected to detect single-bit data stored in the N-th and N+1-th ones of the MIS transistors.

7 Claims, 15 Drawing Sheets

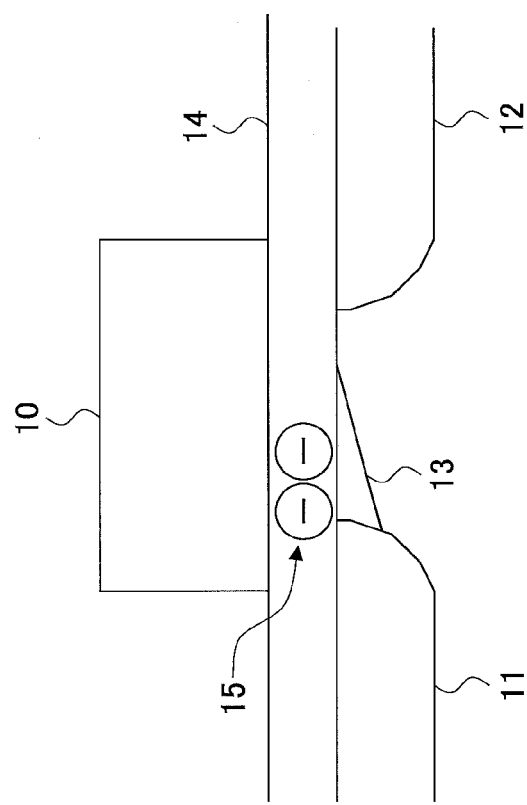
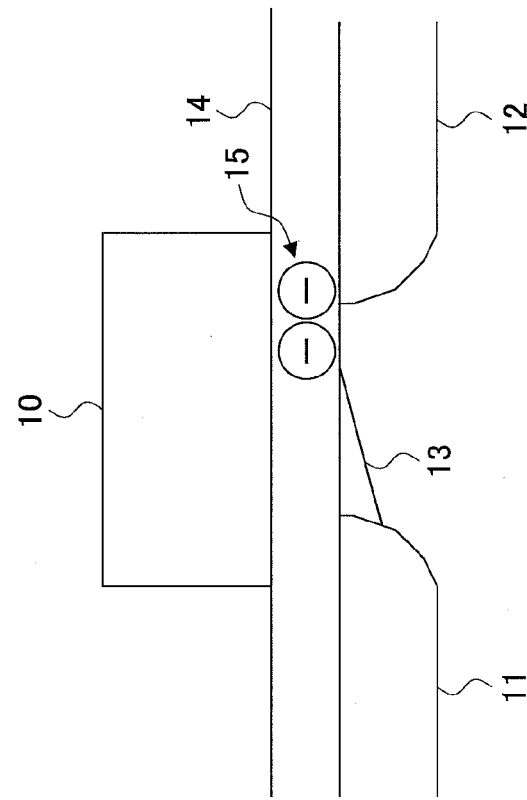

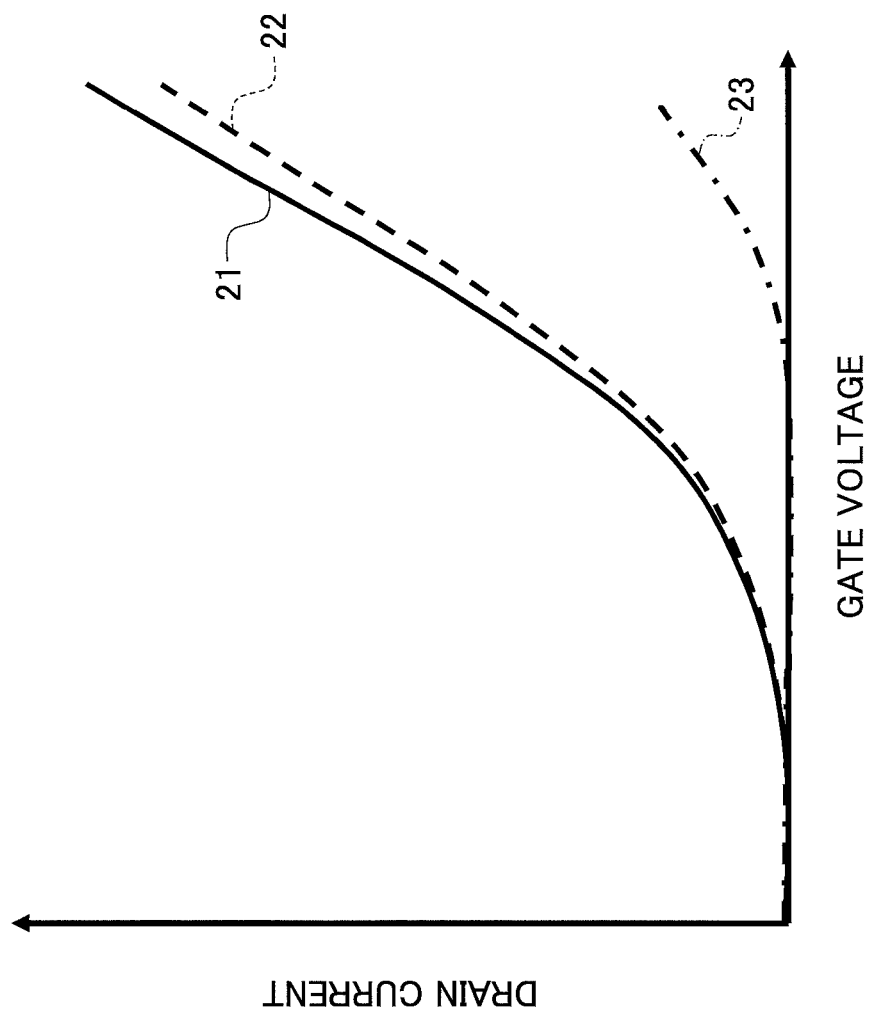

NONVOLATILE MEMORY DEVICE

BACKGROUND OF THE INVENTION

1. Field of the Invention

The disclosures herein generally relate to a memory device, and particularly relate to a nonvolatile memory device which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called Perm-SRAM. PermSRAM uses a pair of MIS (metal-insulating film-semiconductor) transistors as a nonvolatile memory cell (i.e., the basic unit of data storage). The two paired MIS transistors used as a nonvolatile memory cell in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

One of the two paired MIS transistors used as a nonvolatile memory cell in PermSRAM is configured to experience an irreversible hot-carrier effect on purpose for storage of one-bit data. Here, the irreversible hot-carrier effect refers to the injection of electrons into the gate oxide film (i.e., gate insulating film). A difference in the transistor characteristics caused by the hot-carrier effect represents one-bit data "0" or "1". Such a difference may be detected as a difference in the ON current between the two paired MIS transistors by using a sense circuit such as a one-bit static memory circuit (i.e., latch) coupled to the MIS transistor pair.

A hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately a factor of 10.

Such asymmetric characteristics of a hot-carrier effect are attributable to the fact that most of the electrons injected by the hot-carrier effect into the gate oxide film are situated closer to the drain node than to the source node. At the time of detecting a drain current, the presence of trapped electrons near the drain node does not produce a significant drop in the amount of drain current, compared with the case in which no electron is trapped. The presence of trapped electrons near the source node, on the other hand, produces a significant drop in the amount of drain current, compared with the case in which no electron is trapped. Detecting the drain current is thus equivalent to detecting whether trapped electrons are in existence near the source node. Since swapping the directions of drain current results in swapping in the positions of the source node, the above-noted asymmetric characteristics may be utilized to increase memory storage density.

Accordingly, the asymmetric characteristics of a hot-carrier effect may be utilized to increase memory storage density.

SUMMARY OF THE INVENTION

It is a general object of the present invention to provide a nonvolatile memory device that substantially obviates one or more problems caused by the limitations and disadvantages of the related art.

According to an embodiment, a nonvolatile memory device includes a word line, four or more bit lines, three or more MIS transistors having gate nodes thereof connected to the word line, the N-th (N: positive integer) one of the MIS transistors having two source/drain nodes thereof connected to the N-th and N+1-th ones of the bit lines, respectively, a sense circuit having two nodes and configured to amplify a difference between potentials of the two nodes, and a switch circuit configured to electrically couple the N-th and N+2-th ones of the bit lines to the two nodes of the sense circuit, respectively, and to electrically couple the N+1-th one of the bit lines to a fixed potential, for any numerical number N selected to detect single-bit data stored in the N-th and N+1-th ones of the MIS transistors.

According to at least one embodiment, the asymmetric characteristics of a hot-carrier effect is utilized to increase memory storage density.

Other objects and further features of the present invention will be apparent from the following detailed description when read in conjunction with the accompanying drawings.

BRIEF DESCRIPTION OF THE DRAWINGS

FIG. 1 is a drawing illustrating an example of the position of electrons injected by a hot-carrier effect into a gate oxide film;

FIG. 2 is a drawing illustrating another example of the position of electrons injected by a hot-carrier effect into a gate oxide film;

FIG. 3 is a drawing illustrating characteristic curves representing relationships between the gate voltage and the drain current;

DESCRIPTION OF THE PREFERRED EMBODIMENTS

Figure 4:
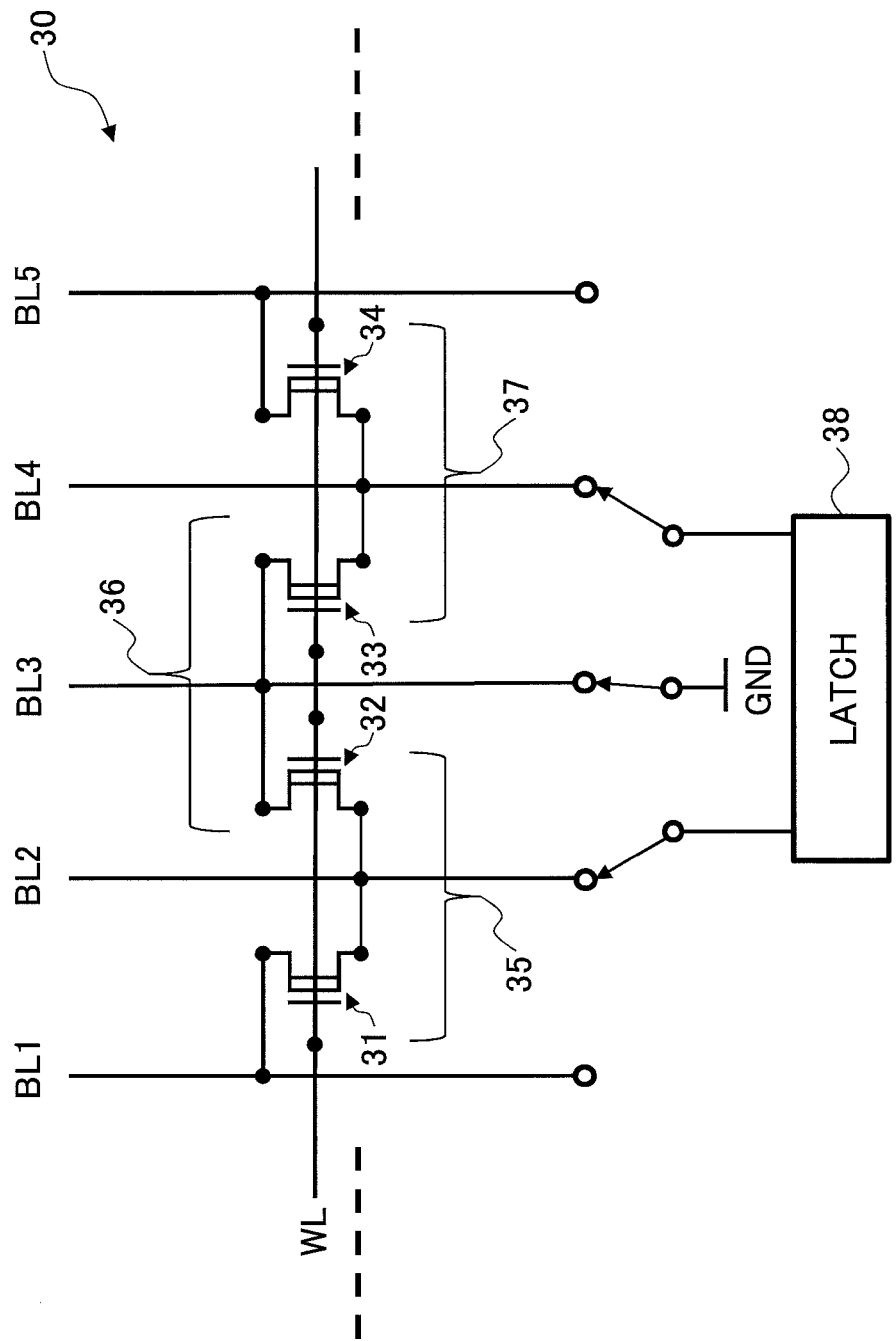
FIG. 4 is a drawing illustrating an example of the configuration of a transistor array used as bit cells.

In the following, embodiments of the present invention will be described with reference to the accompanying drawings. In these drawings, the same elements are referred to by the same numerals, and a description thereof will be omitted as appropriate.

The present invention is directed to a variation of Perm-SRAM. Namely, the memory cell transistors of a bit cell are a pair of MIS (metal-insulating film-semiconductor) transistors that have the same structure as ordinary MIS transistors used for conventional transistor functions (e.g., switching function). These memory cell transistors use neither a special structure such as a floating gate nor a special material such as a ferroelectric material or a ferromagnetic material. The two paired MIS transistors are configured to selectively experience a hot-carrier effect on purpose for storage of one-bit data.

The hot-carrier effect leaves an irreversible, lingering change in the transistor characteristics to one of the two paired MIS transistors, so that the one of the two paired MIS transistors has a higher threshold voltage or a higher ON resistance than the other one of the two paired MIS transistors. A change in the transistor characteristics caused by the hot-carrier effect achieves nonvolatile data retention. Which one of the two paired MIS transistors has a lingering change determines whether the stored data is "0" or "1".

Further, a latch (flip-flop) circuit (i.e., sense circuit) is used to determine data to be stored in the two paired MIS transistors. The latch circuit is also used to detect or read (i.e., sense) the data stored in the two paired MIS transistors. The latch circuit and the two paired MIS transistors together constitute a memory cell unit (memory circuit).

In the following description, NMOS transistors are used as an example of the nonvolatile-memory-cell MIS transistors, but such examples are not intended to be limiting. PMOS transistors may as well be used as nonvolatile-memory-cell transistors.

FIG. 1 is a drawing illustrating an example of the position of electrons injected by a hot-carrier effect into a gate oxide film. An NMOS transistor illustrated in FIG. 1 includes a gate electrode 10, a source region (diffusion region) 11, a drain region (diffusion region) 12, and a gate oxide film 14. The source region 11 and the drain region 12 are formed in a substrate. The gate oxide film 14 is formed on the substrate. The source region 11 and the drain region 12 are electrically coupled to a ground potential and a power-supply potential, respectively. Due to this electrical coupling, a channel 13 is formed between the source region 11 and the drain region 12. A drain current flows from the right-hand side to the left-hand side in FIG. 1, i.e., from the drain region 12 to the source region 11. In FIG. 1, electric charge 15 which is created in advance by the electrons injected into the gate oxide film 14 by a hot-carrier effect is situated closer to the drain region 12 than to the source region 11. Such positioning of the electric charge 15 is obtained when the diffusion region 11 and the diffusion region 12 are used as the source region and the drain region, respectively, at the time of creating the hot-carrier effect.

FIG. 2 is a drawing illustrating another example of the position of electrons injected by a hot-carrier effect into a gate oxide film. In FIG. 2, the same elements as those of FIG. 1 are referred to by the same numerals, and a description thereof will be omitted. In FIG. 2, the electric charge 15 which is created in advance by the electrons injected into the gate oxide film 14 by a hot-carrier effect is situated closer to the source region 11 than to the drain region 12. Such positioning of the electric charge 15 is obtained when the diffusion region 11 and the diffusion region 12 are used as the drain region and the source region, respectively, at the time of creating the hot-carrier effect.

Since the electric charge 15 is closer to the drain region 12 and farther away from the source region 11 in the case illustrated in FIG. 1, the amount of drain current only slightly decreases compared with the case in which the electric charge 15 is nonexistent. Since the electric charge 15 is closer to the source region 11 in the case illustrated in FIG. 2, on the other hand, the amount of drain current significantly decreases compared with the case in which the electric charge 15 is nonexistent.

FIG. 3 is a drawing illustrating characteristic curves representing relationships between the gate voltage and the drain current. The horizontal axis represents the gate voltage, and the vertical axis represents the drain current. A characteristics curve 21 represents the relationship between the gate voltage and the drain current with respect to an NMOS transistor that has not been subjected to a hot-carrier effect, i.e., an NMOS transistor with no electric charge such as the electric charge 15 illustrated in FIGS. 1 and 2. A characteristics curve 22 represents the relationship between the gate voltage and the drain current with respect to an NMOS transistor that has electric charge situated on the drain region side such as in the example illustrated in FIG. 1. A characteristics curve 23 represents the relationship between the gate voltage and the drain current with respect to an NMOS transistor that has electric charge situated on the source region side as in the example illustrated in FIG. 2.

The presence of electric charge 15 closer to the drain region 12 than to the source region 11 as illustrated in FIG. 1 hardly affects the amount of drain current as is illustrated by a negligible difference between the characteristic curve 21 and the characteristic curve 22. On the other hand, the presence of electric charge 15 closer to the source region 11 than to the drain region 12 as illustrated in FIG. 2 significantly affects the amount of drain current as is illustrated by a noticeable difference between the characteristic curve 21 and the characteristic curve 23. These characteristics are caused by the asymmetric characteristics of the hot-carrier effect, and will be utilized to increase memory storage density in a transistor array that will be described in the following.

FIG. 4 is a drawing illustrating an example of the configuration of a transistor array used as bit cells. A transistor array 30 illustrated in FIG. 4 includes NMOS transistors 31 through 34, a word line WL, and bit lines BL1 through BL5. The number of NMOS transistors is not limited to four, and may be three or more. The number of bit lines is not limited to five, and may be four or more. The word line WL is connected to the gates of the NMOS transistors 31 through 34. The source/drain nodes of the NMOS transistor 31 are connected to the bit lines BL1 and BL2, respectively. The source/drain nodes of the NMOS transistor 32 are connected to the bit lines BL2 and BL3, respectively. The source/drain nodes of the NMOS transistor 33 are connected to the bit lines BL3 and BL4, respectively. The source/drain nodes of the NMOS transistor 34 are connected to the bit lines BL4 and BL5, respectively.

Two adjacent NMOS transistors selected from the NMOS transistors 31 through 34 form a bit cell in which a single bit is stored. Specifically, one of the two adjacent NMOS transistors has electric charge (i.e., trapped electrons) on the source sides thereof, and has a relatively small drain current compared with the drain current of the other one of the two adjacent NMOS transistors, which has no electric charge on the source side thereof. There are three bit cells 35 through 37 illustrated in FIG. 4. The bit cell 35 includes the NMOS transistors 31 and 32. The bit cell 36 includes the NMOS transistors 32 and 33. The bit cell 37 includes the NMOS transistors 33 and 34.

Three consecutive bit lines of the bit lines BL1 through BL5 that are connected to a bit cell of interest are electrically coupled either to a latch circuit 38 or to a fixed potential (e.g., ground GND in this example). Specifically, the first and third lines of the three consecutive bit lines are electrically coupled to the latch circuit 38, and the second line of the three consecutive bit lines is electrically coupled to the ground GND. With this arrangement, the latch circuit 38 detects (i.e., determines the logical value of) a single bit stored in the bit cell of interest. In the example illustrated in FIG. 4, the bit lines BL2 and BL4 are electrically coupled to the latch circuit 38, and the bit line BL3 is electrically coupled to the ground GND. In this example, thus, a single bit stored in the bit cell 36 is detected by the latch circuit 38. A switch circuit may be provided to establish selective couplings between the bit lines and the ground GND and between the bit lines and the latch circuit 38.

More specifically, the switch circuit may be configured to electrically couple the N-th and N+2-th ones of the bit lines to the two nodes of the latch circuit 38, respectively, and to electrically couple the N+1-th one of the bit lines to the ground GND when detecting a single-bit data stored in the N-th and N+1-th ones of the NMOS transistors. The switch circuit may be further configured to electrically couple the N+1-th and N+3-th ones of the bit lines to the two nodes of the latch circuit 38, respectively, and to electrically couple the N+2-th one of the bit lines to the ground GND when detecting a single-bit data stored in the N+1-th and N+2-th ones of the NMOS transistors.

Figure 5:
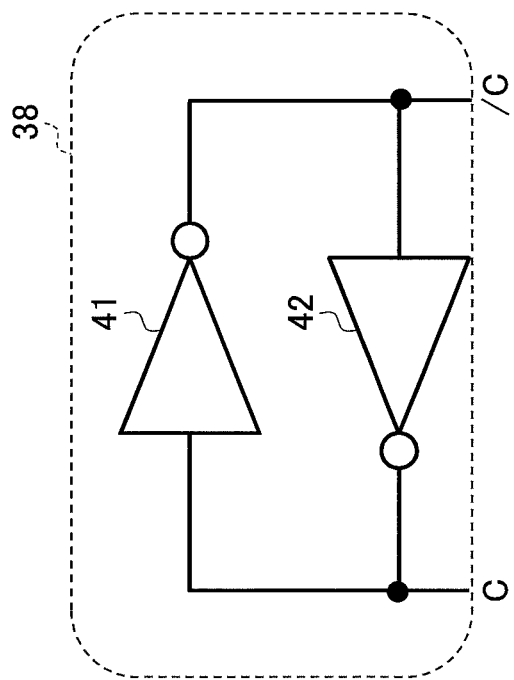
FIG. 5 is a drawing illustrating an example of the configuration of the latch circuit.

FIG. 5 is a drawing illustrating an example of the configuration of the latch circuit 38. The latch circuit 38 illustrated in FIG. 5 includes inverters 41 and 42. The inverters 41 and 42 have the outputs thereof connected to the inputs of each other. Upon power-on of the inverters 41 and 42, nodes C and /C are set to HIGH and LOW or to LOW and HIGH, respectively, depending on the initial signal levels of these nodes. In this manner, the latch circuit 38 serves as a sense circuit that amplifies a difference in the signal level between the nodes C and /C.

Figure 6:
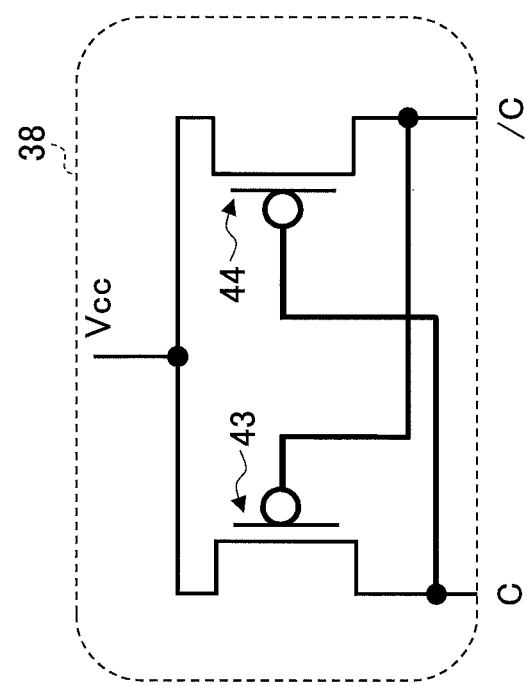
FIG. 6 is a drawing illustrating another example of the configuration of the latch circuit.

FIG. 6 is a drawing illustrating another example of the configuration of the latch circuit 38. The latch circuit 38 illustrated in FIG. 6 includes PMOS transistors 43 and 44. The PMOS transistors 43 and 44 have the drain nodes thereof connected to the gate nodes of each other. Upon a power supply voltage Vcc being applied to the source nodes of the PMOS transistors 43 and 44, nodes C and /C are set to HIGH and LOW or to LOW and HIGH, respectively, depending on the initial signal levels of these nodes. In this manner, the latch circuit 38 serves as a sense circuit that amplifies a difference in the signal level between the nodes C and /C.

Figure 7:
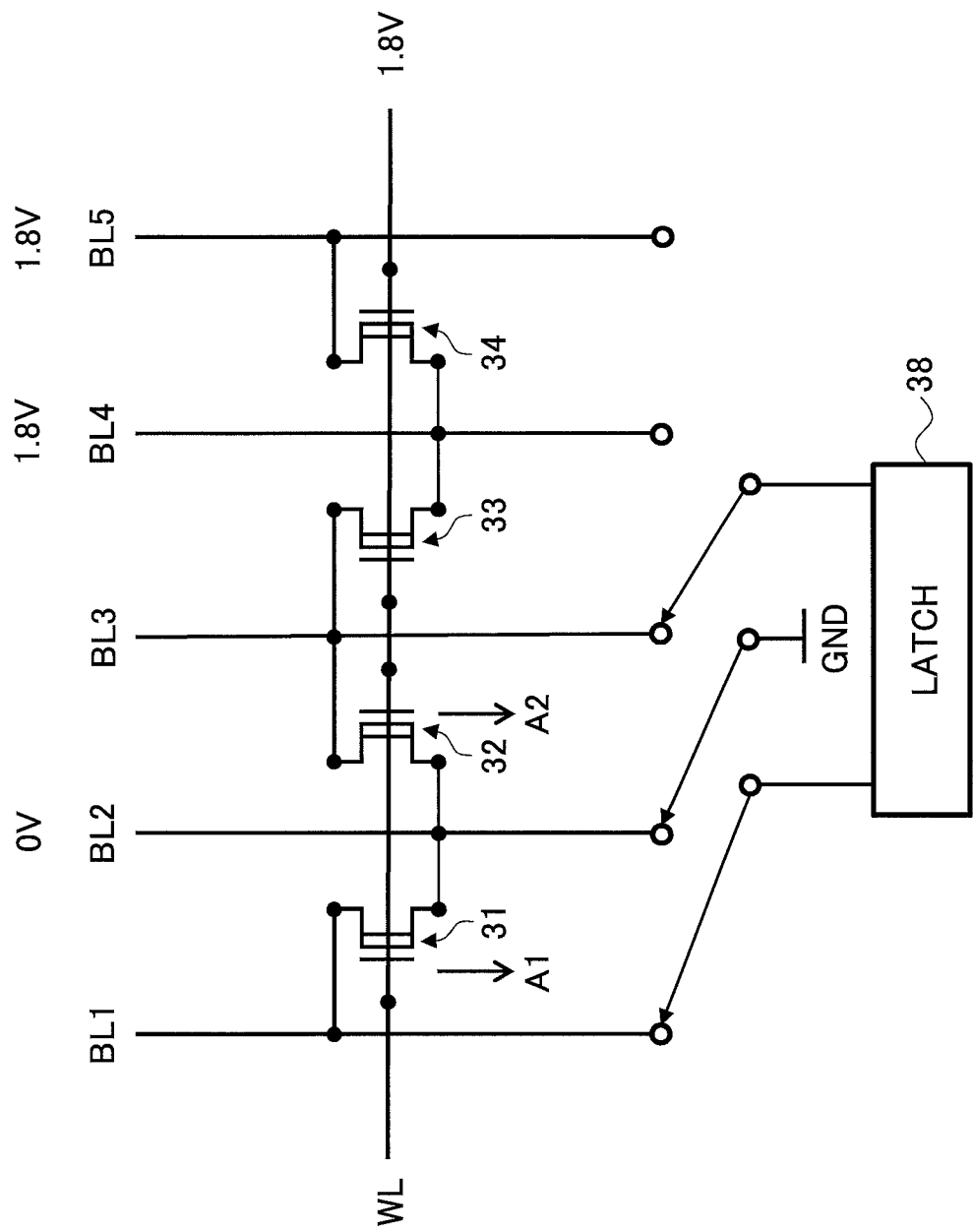
FIG. 7 is a drawing illustrating how a single bit of a bit cell is detected by the latch circuit.

FIG. 7 is a drawing illustrating how a single bit of a bit cell is detected by the latch circuit 38. In the example illustrated in FIG. 7, the latch circuit 38 is supposed to detect a single bit that is stored in the bit cell comprised of the NMOS transistors 31 and 32.

Initially, the bit lines BL1 through BL3 are pre-charged to 1.8 V. Input nodes of the latch circuit 38 are also pre-charged to 1.8 V. Further, the word line WL and the bit lines BL4 and BL5 are fixed to 1.8 V. Electrical coupling is then established between the bit line BL2 and the ground GND. With this electrical coupling, the bit lines BL1 and BL3 discharge, and electrical currents flow through the NMOS transistors 31 and 32 in the directions as illustrated by arrows A1 and A2 in FIG. 7. One of the NMOS transistors 31 and 32 has electrons trapped on the source sides thereof, and has a relatively small drain current, thereby creating a difference in the potential between the bit lines BL1 and BL3. Such a difference is amplified and detected by the latch circuit 38 when electrical coupling is established between each of the bit lines BL1 and BL3 and the latch circuit 38.

It may be noted that the bit line BL4 adjacent to the bit line BL3 is set equal to 1.8 V, and the word line WL is also set equal to 1.8 V, with the bit line BL3 being initially pre-charged to 1.8 V. With this arrangement, the NMOS transistor 33 is initially in the nonconductive state (i.e., turned off). Even when the potential of the bit line BL3 drops due to the drain current flowing from the bit line BL3 to the bit line BL2, the NMOS transistor 33 stays nonconductive until a difference between the potential of the bit line BL3 and 1.8 V becomes greater than a threshold voltage of the transistor. Detection by the latch circuit 38 is completed while the NMOS transistor 33 stays nonconductive. Thus, the presence of an adjacent transistor (i.e., the NMOS transistor 33 in this case) does not affect the detection of bit data stored in the bit cell of interest.

Figure 8:
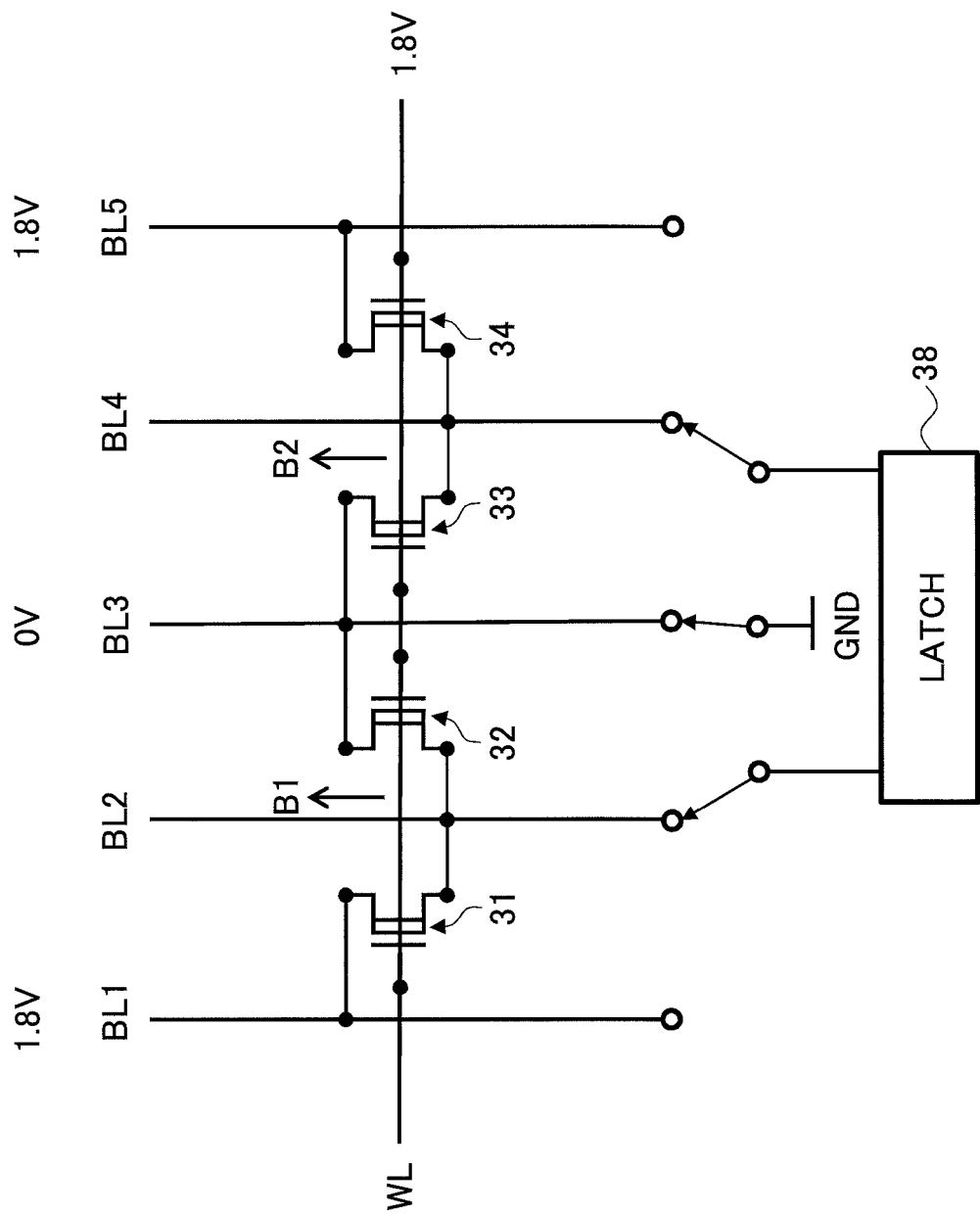
FIG. 8 is a drawing illustrating how a single bit of a bit cell is detected by the latch circuit.

FIG. 8 is a drawing illustrating how a single bit of a bit cell is detected by the latch circuit 38. In the example illustrated in FIG. 8, the latch circuit 38 is supposed to detect a single bit that is stored in the bit cell comprised of the NMOS transistors 32 and 33.

Initially, the bit lines BL2 through BL4 are pre-charged to 1.8 V. Input nodes of the latch circuit 38 are also pre-charged to 1.8 V. Further, the word line WL and the bit lines BL1 and BL5 are fixed to 1.8 V. Electrical coupling is then established between the bit line BL3 and the ground GND. With this electrical coupling, the bit lines BL2 and BL4 discharge, and electrical currents flow through the NMOS transistors 32 and 33 in the directions as illustrated by arrows B1 and B2 in FIG. 8. One of the NMOS transistors 32 and 33 has electrons trapped on the source sides thereof, and has a relatively small drain current, thereby creating a difference in the potential between the bit lines BL2 and BL4. Such a difference is amplified and detected by the latch circuit 38 when electrical coupling is established between each of the bit lines BL2 and BL4 and the latch circuit 38.

It may be noted that the bit line BL1 adjacent to the bit line BL2 and the bit line BL5 adjacent to the bit line BL4 are set equal to 1.8 V, and the word line WL is also set equal to 1.8 V, with the bit lines BL2 and BL4 being initially pre-charged to 1.8 V. With this arrangement, the NMOS transistors 31 and 34 are initially in the nonconductive state (i.e., turned off). Even when the potential of the bit line BL2 or BL4 drops due to the drain current flowing from the bit line BL2 or BL4 to the bit line BL3, the NMOS transistors 31 and 34 stay nonconductive until a difference between the potential of the bit line BL2 or BL4 and 1.8 V becomes greater than a threshold voltage of the transistor. Detection by the latch circuit 38 is completed while the NMOS transistors 31 and 34 stay nonconductive. Thus, the presence of adjacent transistors (i.e., the NMOS transistors 31 and 34 in this case) does not affect the detection of bit data stored in the bit cell of interest.

Further, it may be noted that the direction B1 of drain current flowing through the NMOS transistor 32 in FIG. 8 is opposite the direction A2 of drain current flowing through the NMOS transistor 32 in FIG. 7. Namely, the position of the source node of the NMOS transistor 32 in FIG. 8 is different from the position of the source node of the NMOS transistor 32 in FIG. 7. The fact that the presence or absence of trapped electrons on the source region side only affects the amount of drain current ensures that the data detected in the case of FIG. 8 is independent of the data detected in the case of FIG. 7.

Figure 9:
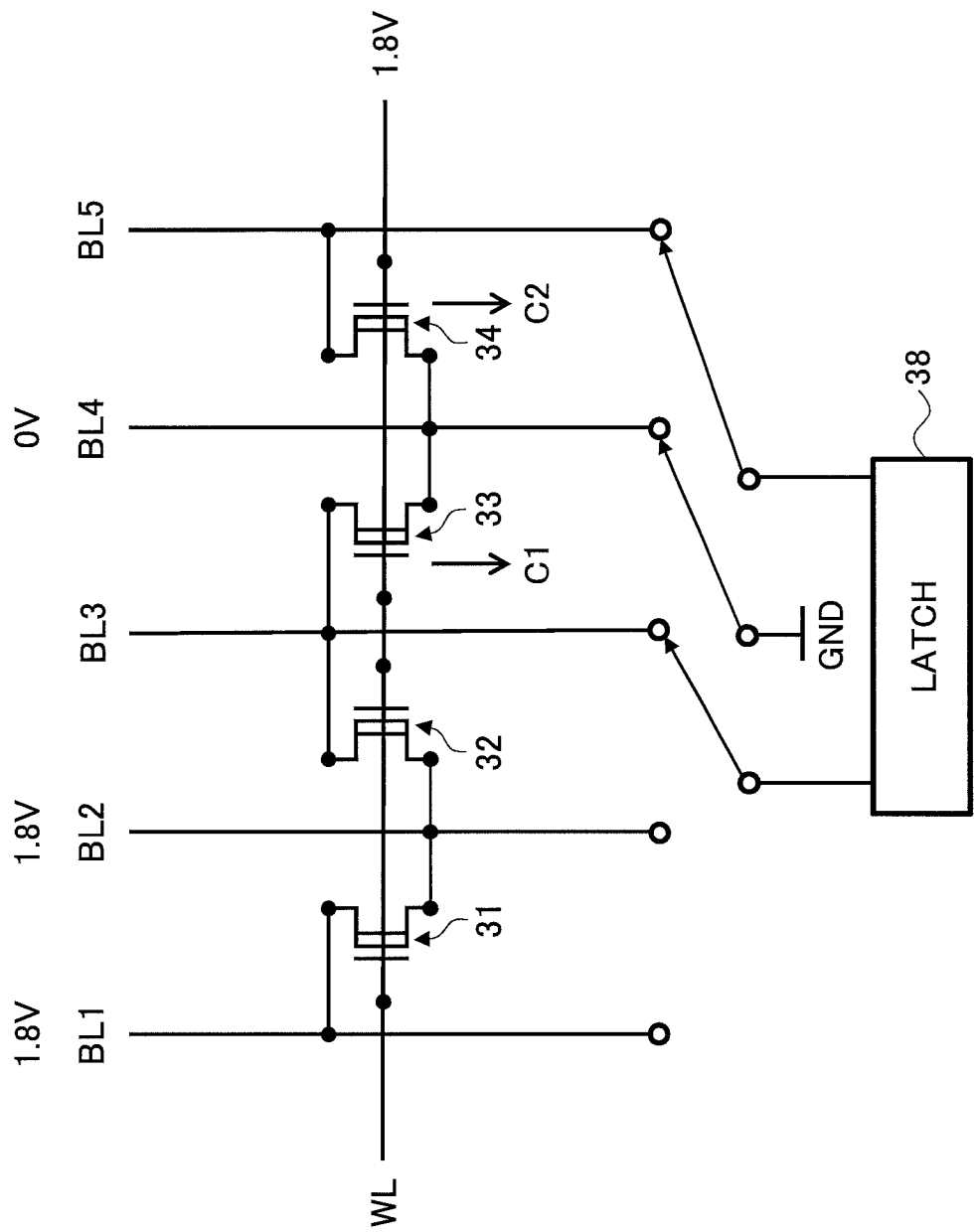
FIG. 9 is a drawing illustrating how a single bit of a bit cell is detected by the latch circuit.

FIG. 9 is a drawing illustrating how a single bit of a bit cell is detected by the latch circuit 38. In the example illustrated in FIG. 9, the latch circuit 38 is supposed to detect a single bit that is stored in the bit cell comprised of the NMOS transistors 33 and 34.

Initially, the bit lines BL3 through BL5 are pre-charged to 1.8 V. Input nodes of the latch circuit 38 are also pre-charged to 1.8 V. Further, the word line WL and the bit lines BL1 and BL2 are fixed to 1.8 V. Electrical coupling is then established between the bit line BL4 and the ground GND. With this electrical coupling, the bit lines BL3 and BL5 discharge, and electrical currents flow through the NMOS transistors 33 and 34 in the directions as illustrated by arrows C1 and C2 in FIG. 9. One of the NMOS transistors 33 and 34 has electrons trapped on the source sides thereof, and has a relatively small drain current, thereby creating a difference in the potential between the bit lines BL3 and BL5. Such a difference is amplified and detected by the latch circuit 38 when electrical coupling is established between each of the bit lines BL3 and BL5 and the latch circuit 38.

It may be noted that the bit line BL2 adjacent to the bit line BL3 is set equal to 1.8 V, and the word line WL is also set equal to 1.8 V, with the bit line BL3 being initially pre-charged to 1.8 V. With this arrangement, the NMOS transistor is initially in the nonconductive state (i.e., turned off). Even when the potential of the bit line BL3 drops due to the drain current flowing from the bit line BL3 to the bit line BL4, the NMOS transistor 32 stays nonconductive until a difference between the potential of the bit line BL3 and 1.8 V becomes greater than a threshold voltage of the transistor. Detection by the latch circuit 38 is completed while the NMOS transistor 32 stays nonconductive. Thus, the presence of an adjacent transistor (i.e., the NMOS transistor 32 in this case) does not affect the detection of bit data stored in the bit cell of interest.

Further, it may be noted that the direction C1 of drain current flowing through the NMOS transistor 33 in FIG. 9 is opposite the direction B2 of drain current flowing through the NMOS transistor 33 in FIG. 8. Namely, the position of the source node of the NMOS transistor 33 in FIG. 9 is different from the position of the source node of the NMOS transistor 33 in FIG. 8. The fact that the presence or absence of trapped electrons on the source region side only affects the amount of drain current ensures that the data detected in the case of FIG. 9 is independent of the data detected in the case of FIG. 8.

Figure 10:
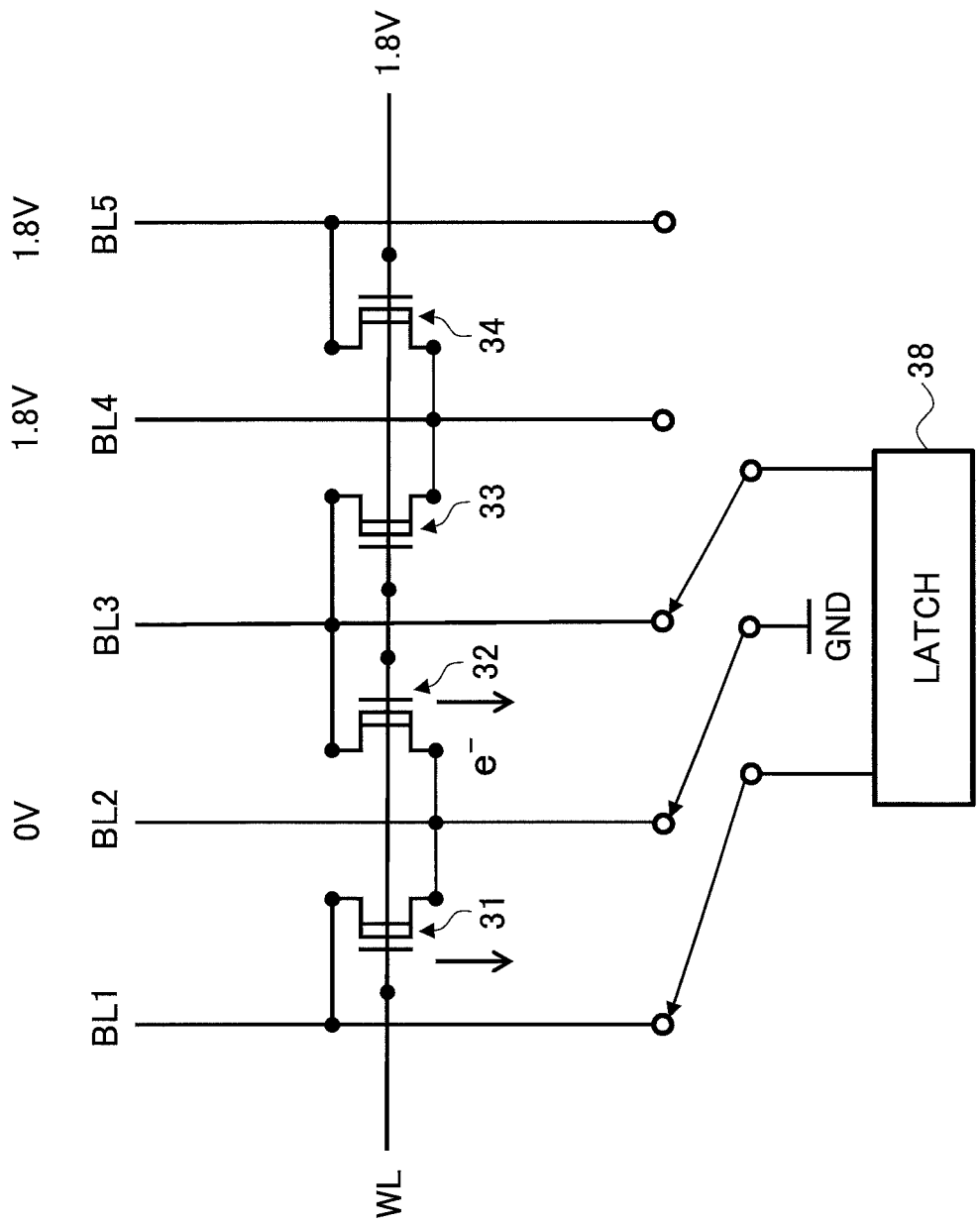
FIG. 10 is a drawing illustrating an example of a single-bit data detected in the configuration illustrated in FIG. 7.

FIG. 10 is a drawing illustrating an example of a single-bit data detected in the configuration illustrated in FIG. 7. In FIG. 10, no electric charge is present on the source region side of the NMOS transistor 31 while electric charge e⁻ is in existence on the source region side of the NMOS transistor 32. In this case, the drain current flowing through the NMOS transistor 31 is larger than the drain current flowing through the NMOS transistor 32. The potential of the bit line BL1 drops from 1.8 V to 1.5 V, for example, while the potential of the bit line BL3 remains at 1.8 V. Upon being connected to the latch circuit 38, the bit lines BL1 and BL3 are set equal to 0 V and 1.8 V, respectively. In this case, data "1" may be detected.

Figure 11:
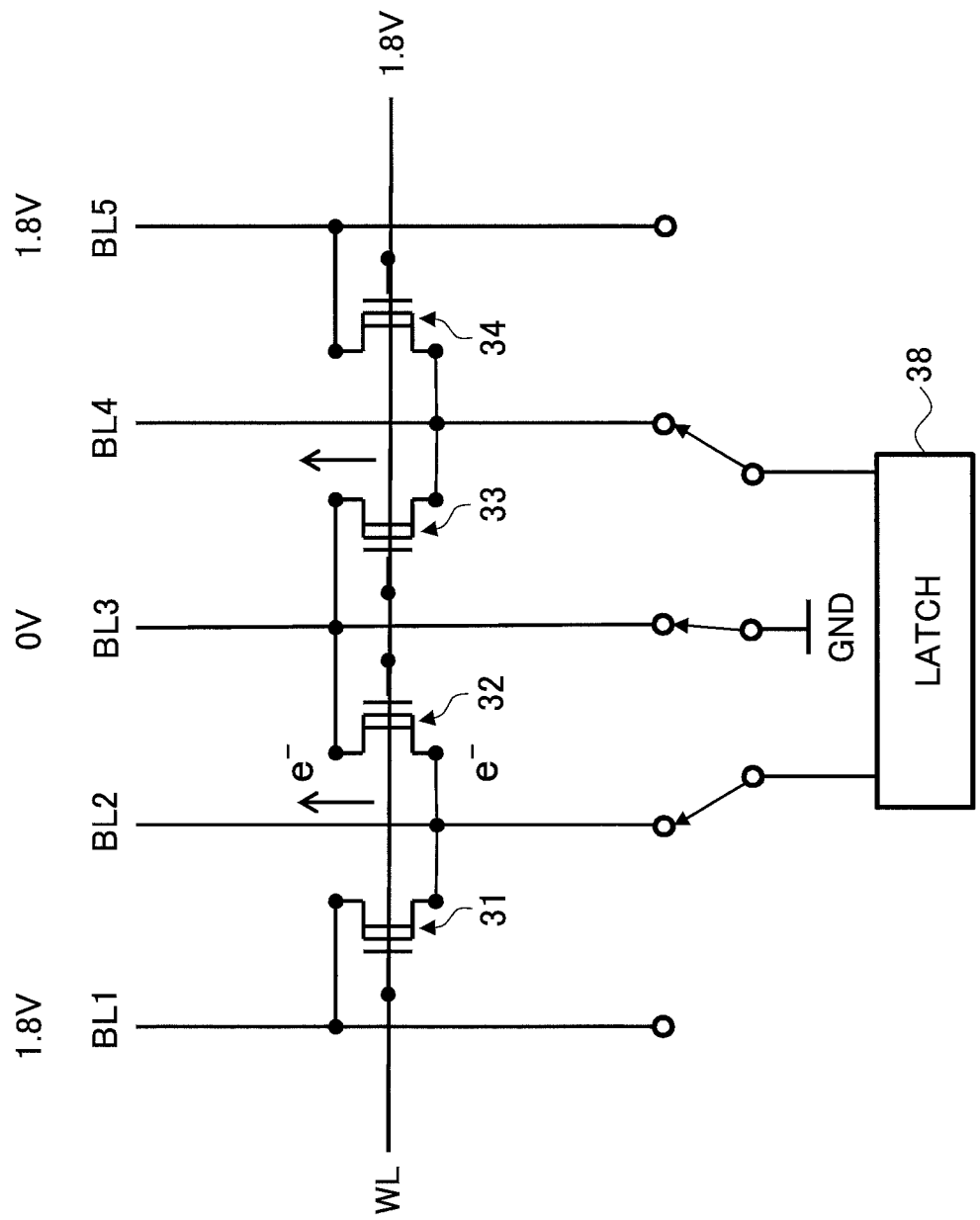
FIG. 11 is a drawing illustrating an example of a single-bit data detected in the configuration illustrated in FIG. 8.

FIG. 11 is a drawing illustrating an example of a single-bit data detected in the configuration illustrated in FIG. 8. In FIG. 11, electric charge e⁻ is in existence on the source region side of the NMOS transistor 32 while no electric charge is present on the source region side of the NMOS transistor 33. In this case, the drain current flowing through the NMOS transistor 33 is larger than the drain current flowing through the NMOS transistor 32. It should be noted that the existence of electric charge on the drain region side of the NMOS transistor 32 hardly affects the amount of drain current. The potential of the bit line BL4 drops from 1.8 V to 1.5 V, for example, while the potential of the bit line BL2 remains at 1.8 V. Upon being connected to the latch circuit 38, the bit lines BL2 and BL4 are set equal to 1.8 V and 0 V, respectively. In this case, data "0" may be detected.

Figure 12:
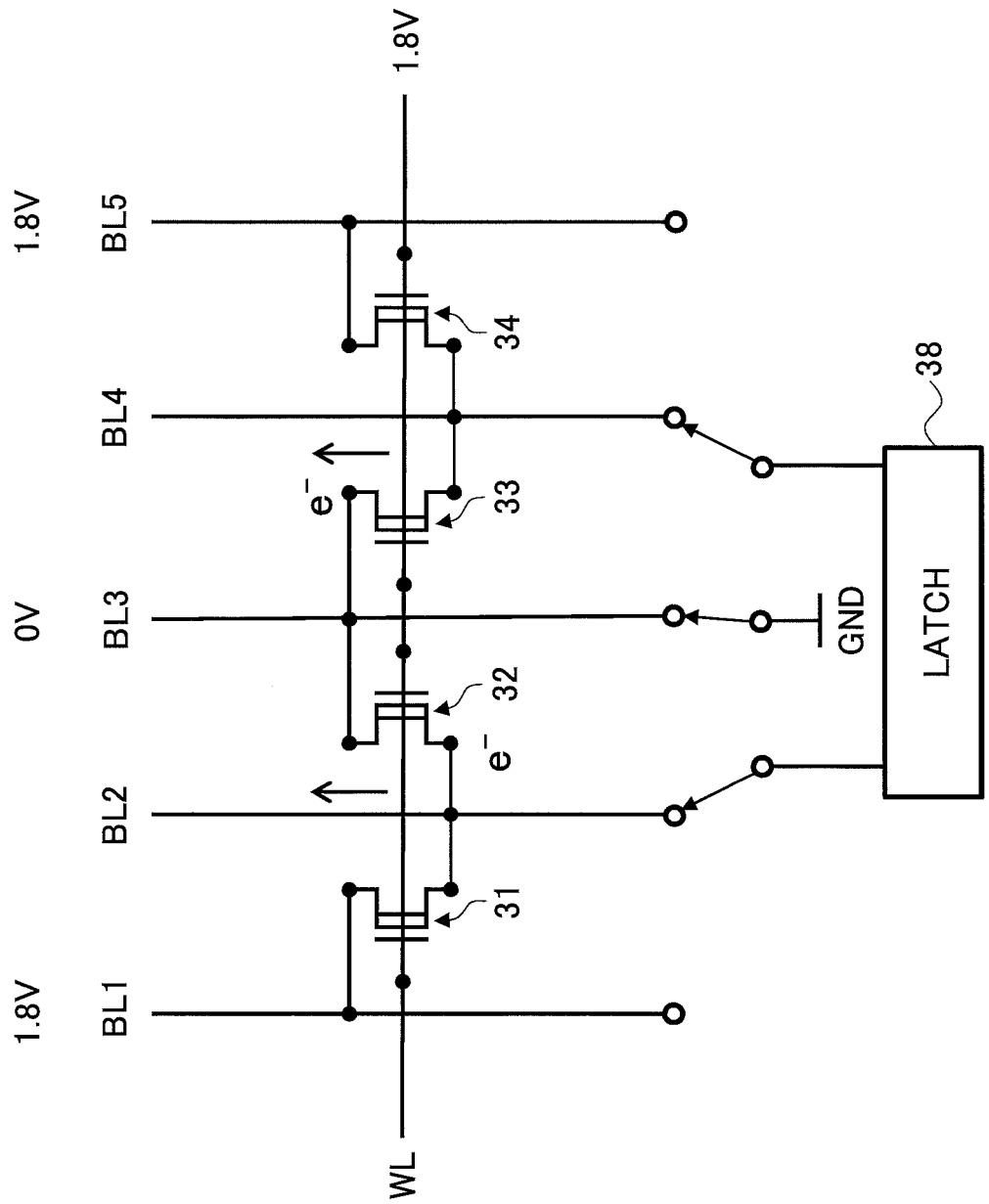
FIG. 12 is a drawing illustrating another example of a single-bit data detected in the configuration illustrated in FIG. 8.

FIG. 12 is a drawing illustrating another example of a single-bit data detected in the configuration illustrated in FIG. 8. In FIG. 12, electric charge e⁻ is in existence on the source region side of the NMOS transistor 33 while no electric charge is present on the source region side of the NMOS transistor 32. In this case, the drain current flowing through the NMOS transistor 32 is larger than the drain current flowing through the NMOS transistor 33. It should be noted that the existence of electric charge on the drain region side of the NMOS transistor 32 hardly affects the amount of drain current. The potential of the bit line BL2 drops from 1.8 V to 1.5 V, for example, while the potential of the bit line BL4 remains at 1.8 V. Upon being connected to the latch circuit 38, the bit lines BL2 and BL4 are set equal to 0 V and 1.8 V, respectively. In this case, data "1" may be detected.

Figure 13:
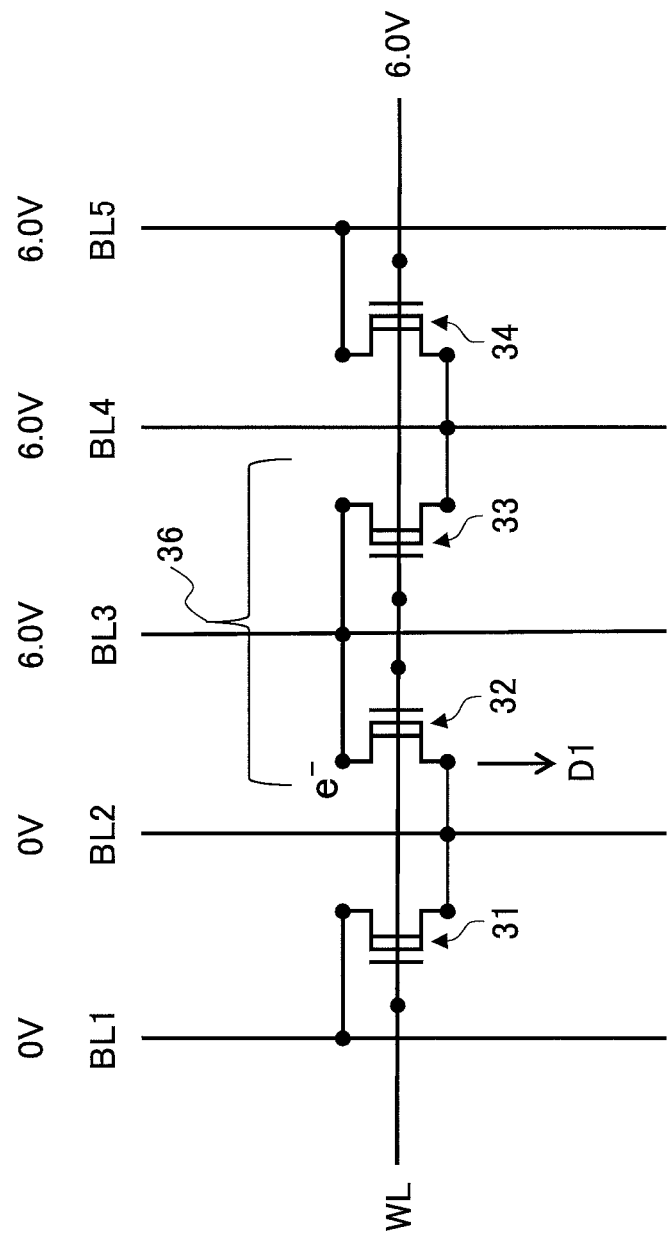
FIG. 13 is a drawing illustrating an example of the configuration that is used to write data in a bit cell.

FIG. 13 is a drawing illustrating an example of the configuration that is used to write data in a bit cell. In the example illustrated in FIG. 13, the bit lines BL1 through BL5 and word line WL are set to respective potentials to write data "0" to the bit cell 36. Specifically, the bit lines BL1, BL2, BL3, BL4 and BL5 are set equal to 0 V, 0 V, 6.0 V, 6.0 V and 6.0 V, respectively. Further, the word line WL is set equal to 6.0 V. Since the bias voltage equal to 6.0 V is larger than voltages used in the routine switching operations of NMOS transistors, the NMOS transistor 32 experiences a strong hot-carrier effect. The hot-carrier effect serves to inject electrons into the gate oxide film mainly at a position close to the drain region. In this case, the drain current flows from the bit line BL3 to the bit line BL2 in a direction D1, so that electric charge e⁻ is generated close to the node that is connected to the bit line BL3.

Figure 14:
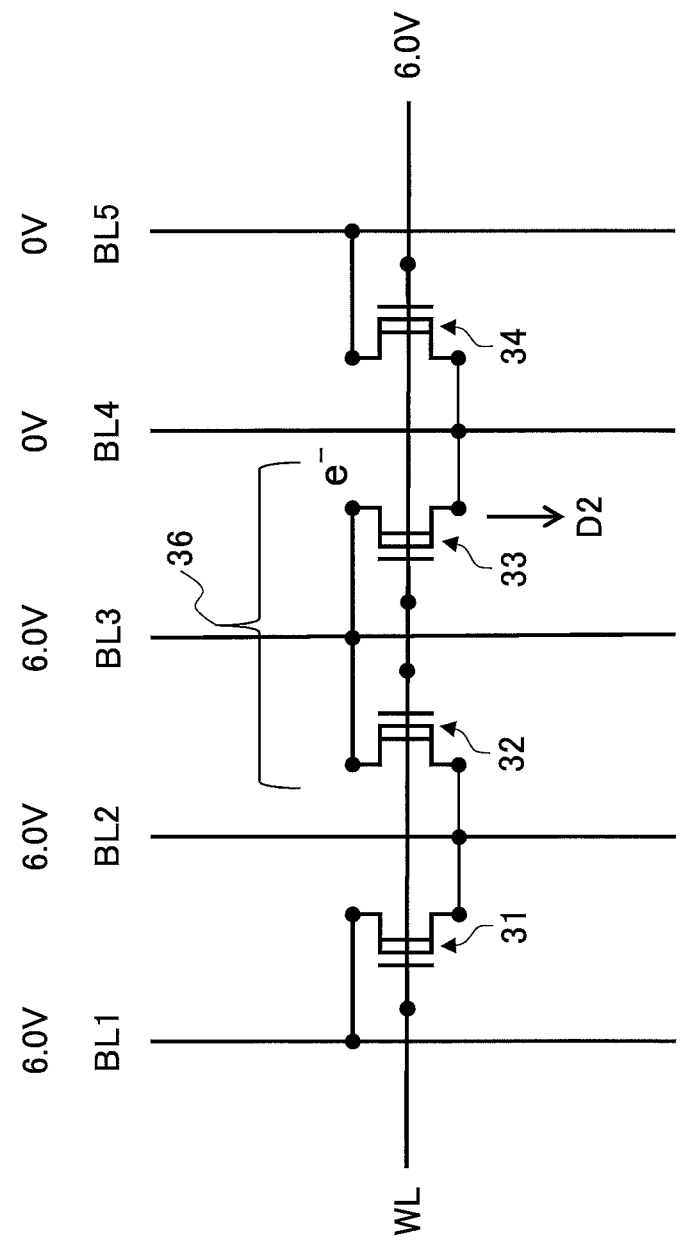
FIG. 14 is a drawing illustrating another example of the configuration that is used to write data in a bit cell.

FIG. 14 is a drawing illustrating another example of the configuration that is used to write data in a bit cell. In the example illustrated in FIG. 14, the bit lines BL1 through BL5 and word line WL are set to respective potentials to write data "1" to the bit cell 36. Specifically, the bit lines BL1, BL2, BL3, BL4 and BL5 are set equal to 6.0 V, 6.0 V, 6.0 V, 0 V and 0 V, respectively. Further, the word line WL is set equal to 6.0 V. Since the bias voltage equal to 6.0 V is larger than voltages used in the routine switching operations of NMOS transistors, the NMOS transistor 33 experiences a strong hot-carrier effect. The hot-carrier effect serves to inject electrons into the gate oxide film mainly at a position close to the drain region. In this case, the drain current flows from the bit line BL3 to the bit line BL4 in a direction D2, so that electric charge e⁻ is generated close to the node that is connected to the bit line BL3.

Figure 15:
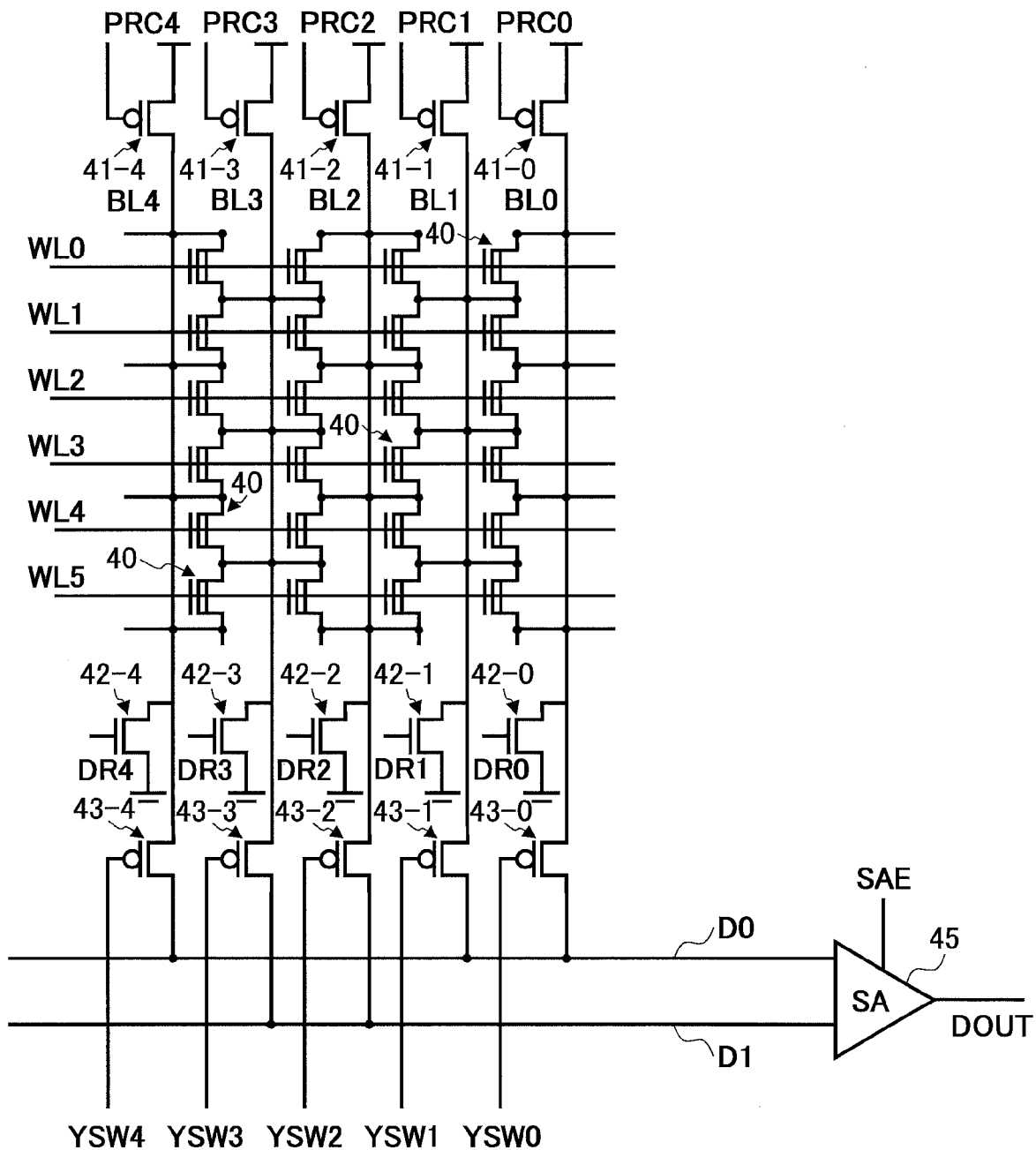
FIG. 15 is a drawing illustrating an example of the configuration of a transistor array in which transistors are arranged in a matrix.

FIG. 15 is a drawing illustrating an example of the configuration of a transistor array in which transistors are arranged in a matrix. The transistor array illustrated in FIG. 15 includes a plurality of NMOS transistors 40, bit lines BL0 through BL4, word lines WL0 through WL5, PMOS transistors 41-0 through 41-4, NMOS transistors 42-0 through 42-4, and PMOS transistors 43-0 through 43-4. The transistor array is connected to data bus lines D0 and D1 that are connected to a sense amplifier 45.

The NMOS transistors 40 are nonvolatile-memory-cell MIS transistors to which data are written by use of a hot-carrier effect as described heretofore. Only some of the NMOS transistors 40 are designated by the reference numeral "40" for the sake of clarity of illustration. The number of NMOS transistors 40, the number of rows of NMOS transistors 40, and the number of columns of NMOS transistors 40 illustrated in FIG. 15 are examples only, and are not intended to be limiting. Each of the word lines WL0 through WL5 is connected to the gates of four NMOS transistors 40 arranged in a single row. Each of the bit lines BL0 and BL4 is connected to the source/drain nodes of six NMOS transistors 40 arranged in a single column. Each of the bit lines BL1 through BL3 is connected to the source/drain nodes of twelve NMOS transistors 40 arranged in two adjacent columns.

Pre-charge signals PRC0 through PRC4 are applied to the gates of the PMOS transistors 41-0 through 41-4, respectively, and are set to LOW to pre-charge the bit lines BL0 through BL4, respectively. Data read signals DR0 through DR4 are applied to the gates of the NMOS transistors 42-0 through 42-4. A selected one of the data read signals DR0 through DR4 is set to HIGH while the remaining data read signals are set to LOW, so that one of the bit lines BL0 through BL4 is electrically coupled to the ground. Column switch signals YSW0 through YSW4 are applied to the gates of the PMOS transistors 43-0 through 43-4. Two of the column switch signals YSW0 through YSW4 are set to LOW while the remaining column switch signals YSW0 through YSW4 are set to HIGH, so that two of the bit lines BL0 through BL4 are electrically coupled to the data bus lines D0 and D1. The NMOS transistors 42-0 through 42-4 and the PMOS transistors 43-0 through 43-4 serve as a switch circuit to establish selective couplings between the bit lines and the ground and between the bit lines and the sense amplifier 45 (i.e., latch circuit). The sense amplifier 45 amplifies a difference in the potential between the data bus lines D0 and D1 to detect (i.e., sense) a single bit that is read from the transistor array.

The NMOS transistors 40 arranged in a single row and connected to the same word line serve to function as memory cell transistors in the same or similar manner as the NMOS transistors 31 through 34 illustrated in FIG. 4. Operations of the circuit illustrated in FIG. 15 will be described in the following.

Figure 16:
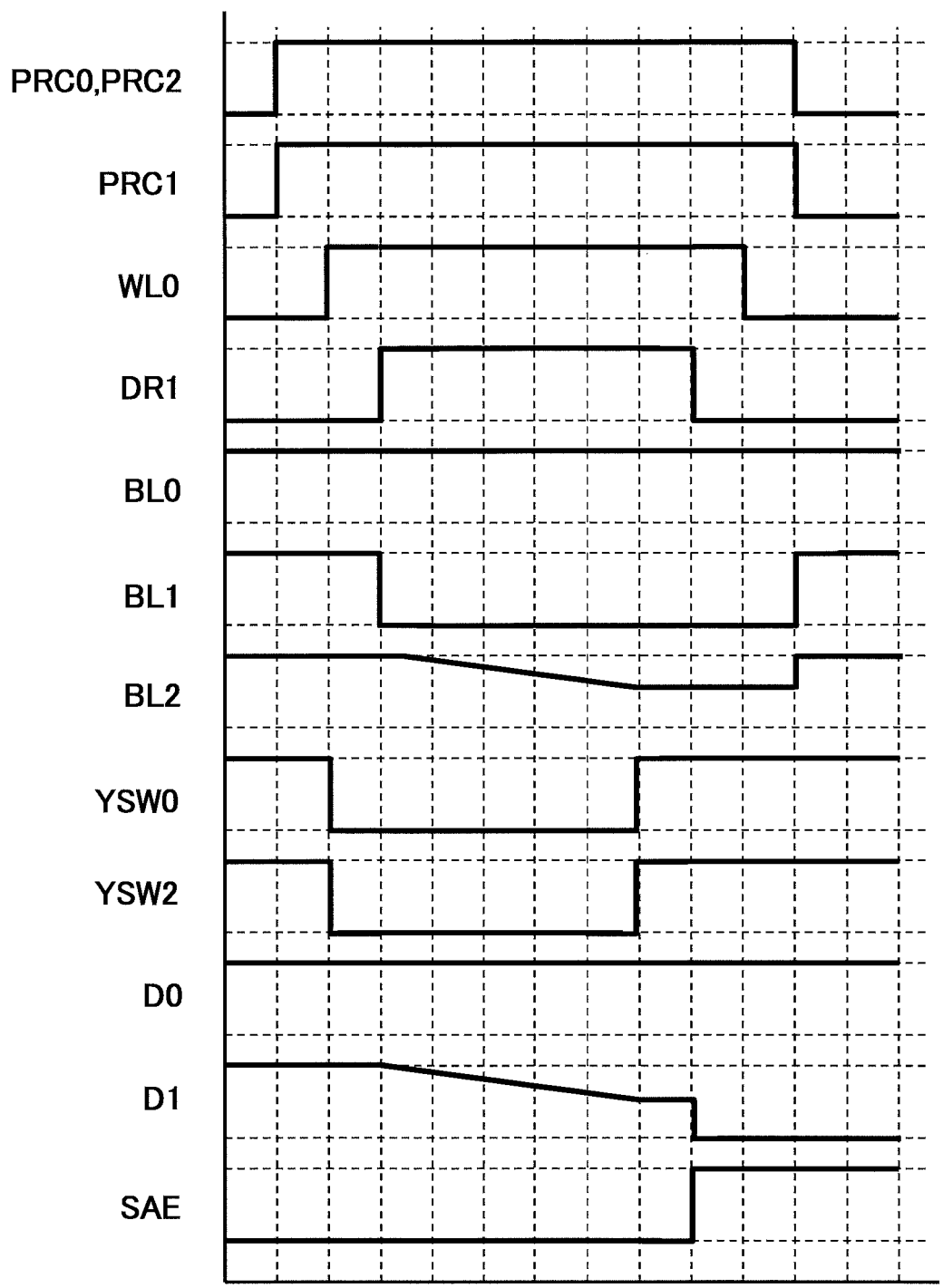
FIG. 16 is a drawing illustrating signal waveforms relating to the operations of the circuit illustrated in FIG. 15.

FIG. 16 is a drawing illustrating signal waveforms relating to the operations of the circuit illustrated in FIG. 15. The pre-charge signals PRC0, PRC1 and PRC2 are initially set to LOW, thereby pre-charging the bit lines BL0, BL1 and BL2 to 1.8 V, for example. After the pre-charge signals PRC0, PRC1 and PRC2 are changed to HIGH, the word line WL0 is set to HIGH (e.g., 1.8 V). In this example, the remaining word lines remain at LOW. Further, the column switch signals YSW0 and YSW2 are set to LOW to electrically couple the bit lines BL0 and BL2 to the data bus lines D0 and D1, respectively. Subsequently, the data read signal DR1 is set to LOW to couple the bit line BL1 to the ground. In response to the setting of the bit line BL1 to LOW, the bit lines BL0 and BL2 start to discharge. In this example, the NMOS transistor 40 connected to the word line WL0 and situated between the bit line BL0 and BL1 has electric charge (i.e., trapped electrons) close to the source node thereof whereas the NMOS transistor 40 connected to the word line WL0 and situated between the bit line BL2 and BL1 has no electric charge (i.e., no trapped electrons) close to the source node thereof. The potential of the bit line BL2 gradually lowers due to the discharge while the potential of the bit line BL0 remains substantially at HIGH.

Since the bit lines BL0 and BL2 are in electrical contact with the data bus lines D0 and D1, the potentials of the data bus lines D0 and D1 are the same as the potentials of the bit lines BL0 and BL2, respectively. The column switch signals YSW0 and YSW2 are then set to HIGH to disconnect the bit lines BL0 and BL2 from the data bus lines D0 and D1, respectively. After that, a sense amplifier enable signal SAE is set to HIGH to activate the sense amplifier 45. Upon the activation of the sense amplifier 45, a difference in the potential between the data bus line D0 and the data bus line D1 is amplified and sensed by the sense amplifier 45.

Figure 17:
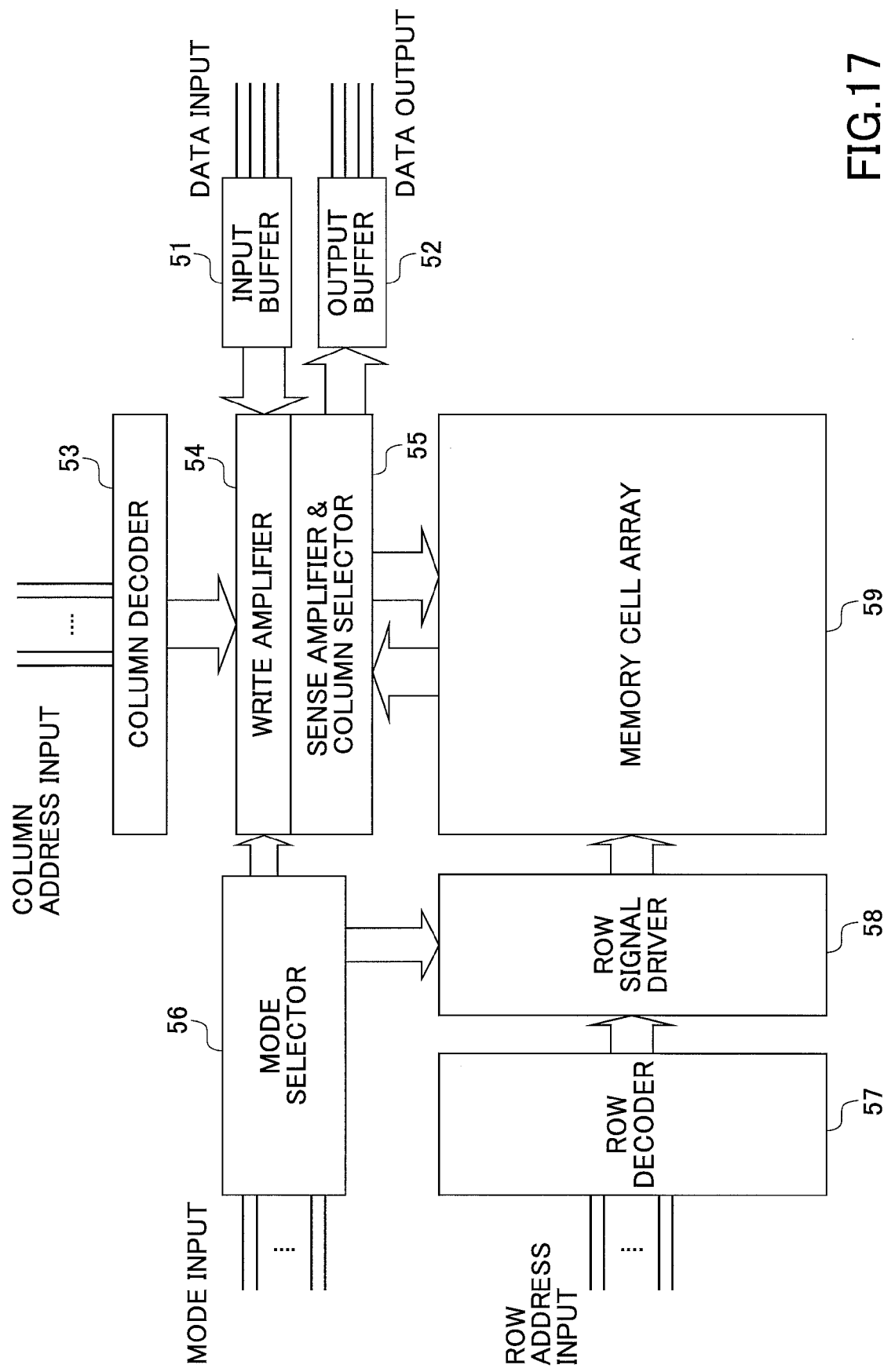
FIG. 17 is a block diagram illustrating an example of the configuration of a nonvolatile semiconductor memory device.

FIG. 17 is a block diagram illustrating an example of the configuration of a nonvolatile semiconductor memory device. A semiconductor memory device shown in FIG. 17 includes an input buffer 51, an output buffer 52, a column decoder 53, a write amplifier 54, a sense amplifier & column selector 55, a mode selector 56, a row decoder 57, a row signal driver 58, and a memory cell array 59.

The memory cell array 59 has the same or similar configuration as the transistor array illustrated in FIG. 15 while the number of NMOS transistors, the number of rows, and the number of columns are determined according to design needs. The NMOS transistors arranged in the same column are connected to the same bit lines, and the memory cells arranged in the same row are connected to the same word line.

The mode selector 56 receives mode input signals from outside the device, and decodes the mode input signal to determine an operation mode (e.g., a write operation mode or a read operation mode). Control signals responsive to the determined operation mode are supplied to the write amplifier 54, the sense amplifier & column selector 55, the row signal driver 58, etc., for control of the individual parts of the semiconductor memory device.

The column decoder 53 receives a column address input from outside the device, and decodes the column address input to determine a selected column. The decode signals indicative of the selected column are supplied to the write amplifier 54 and the sense amplifier & column selector 55.

The row decoder 57 receives a row address input from outside the device, and decodes the row address input to determine a selected row. The decode signals indicative of the selected row are supplied to the row signal driver 58.

In response to the control signals from the mode selector 56 and the decode signals from the row decoder 57, the row signal driver 58 activates a selected word line among the word lines extending from the row signal driver 58. As a result of the activation of the selected word line, the NMOS transistors connected to this word line are turned on. With this arrangement, the writing/reading of data to/from the NMOS transistors is performed.

In response to the control signals from the mode selector 56 and the decode signals from the column decoder 53, the sense amplifier & column selector 55 couples the bit lines corresponding to the selected column to data bus lines. Through this coupling, data is transferred between the memory cell array 59 and the data bus lines. The sense amplifier & column selector 55 amplifies the data read from the memory cell array 59 for provision to the output buffer 52. The data is output from the output buffer 52 to outside the device as output data. Input data supplied to the input buffer 51 is provided to the write amplifier 54. The write amplifier 54 sets the bit lines to respective potentials as described in connection with FIGS. 13 and 14 to write the input data to the memory cell array 59.

Further, the present invention is not limited to these embodiments, but various variations and modifications may be made without departing from the scope of the present invention.

What is claimed is:

1. A nonvolatile memory device, comprising:
   a word line;
   four or more bit lines;
   three or more MIS transistors having gate nodes thereof connected to the word line, the N-th (N: positive integer) one of the MIS transistors having two source/drain nodes thereof connected to the N-th and N+1-th ones of the bit lines, respectively;
   a sense circuit having two nodes and configured to amplify a difference between potentials of the two nodes; and
   a switch circuit configured to electrically couple at a given point in time the N-th and N+2-th ones of the bit lines concurrently to the two nodes of the sense circuit, respectively, and to electrically couple at the given point in time the N+1-th one of the bit lines to a fixed potential, for any numerical number N selected to detect single-bit data stored in a pair of the N-th and N+1-th ones of the MIS transistors.

2. The nonvolatile memory device as claimed in claim 1, wherein the switch circuit is configured to electrically couple the N+1-th and N+3-th ones of the bit lines to the two nodes of the sense circuit, respectively, and to electrically couple the N+2-th one of the bit lines to the fixed potential, when detecting single-bit data stored in the N+1-th and N+2-th ones of the MIS transistors.

3. The nonvolatile memory device as claimed in claim 2, wherein when the single-bit data stored in the N-th and N+1-th ones of the MIS transistors is to be detected, electric currents flow from the N-th and N+2-th ones of the bit lines to the N+1-th one of the bit lines through the N-th and N+1-th ones of the MIS transistors, respectively, and wherein when the single-bit data stored in the N+1-th and N+2-th ones of the MIS transistors is to be detected, electric currents flow from the N+1-th and N+3-th ones of the bit lines to the N+2-th one of the bit lines through the N+1-th and N+2-th ones of the MIS transistors, respectively.

4. The nonvolatile memory device as claimed in claim 3, wherein the single-bit data stored in the N-th and N+1-th ones of the MIS transistors is detected independently of the single-bit data stored in the N+1-th and N+2-th ones of the MIS transistors.

5. The nonvolatile memory device as claimed in claim 1, wherein when single-bit data is stored in the N-th and N+1-th ones of the MIS transistors, one of the N-th and N+1-th ones of the MIS transistors has electric charge in a gate insulating film closer to one of the two source/drain nodes thereof connected to the N+1-th one of the bit lines than to the other one of the two source/drain nodes thereof, and the other one of the N-th and N+1-th ones of the MIS transistors has no electric charge in a gate insulating film closer to one of the two source/drain nodes thereof connected to the N+1-th one of the bit lines than to the other one of the two source/drain nodes thereof.

6. The nonvolatile memory device as claimed in claim 1, wherein when the single-bit data stored in the N-th and N+1-th ones of the MIS transistors is to be detected, the word line is set to a second fixed potential, and the N-th, N+1-th and N+2-th ones of the bit lines are pre-charged to the second fixed potential, with at least the N−1-th and N+3-th ones of the bit lines being set to the second fixed potential.

7. The nonvolatile memory device as claimed in claim 1, wherein the N+1-th one of the bit lines is electrically coupled to the fixed potential after the N-th, N+1-th and N+2-th ones of the bit lines are pre-charged to a predetermined potential, and the N-th and N+2-th ones of the bit lines are electrically coupled to the two nodes of the sense circuit, respectively, after the N+1-th one of the bit lines is electrically coupled to the fixed potential.

* * * * *